United States Patent
Jang et al.

(10) Patent No.: US 8,664,020 B2
(45) Date of Patent: Mar. 4, 2014

(54) SEMICONDUCTOR LIGHT EMITTING DEVICE AND METHOD OF MANUFACTURING THE SAME

(75) Inventors: Tae Sung Jang, Gyunggi-do (KR); Su Yeol Lee, Gyunggi-do (KR); Jong Gun Woo, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 260 days.

(21) Appl. No.: 12/620,928

(22) Filed: Nov. 18, 2009

(65) Prior Publication Data

US 2010/0133570 A1  Jun. 3, 2010

(30) Foreign Application Priority Data

Dec. 3, 2008 (KR) .......................... 10-2008-0122085

(51) Int. Cl.
*H01L 21/00* (2006.01)

(52) U.S. Cl.
USPC .. 438/29; 257/98; 257/E33.067; 257/E21.211

(58) Field of Classification Search
USPC ................ 438/29; 257/98, E33.067, E21.211
See application file for complete search history.

(56) References Cited

U.S. PATENT DOCUMENTS

| | | | | |
|---|---|---|---|---|
| 5,561,079 A | * | 10/1996 | Partin | 438/498 |
| 6,844,569 B1 | * | 1/2005 | Lee et al. | 257/79 |
| 7,102,175 B2 | | 9/2006 | Orita | |
| 2009/0267103 A1 | | 10/2009 | Muraki et al. | |

FOREIGN PATENT DOCUMENTS

| | | |
|---|---|---|
| JP | 2002-286906 | 10/2002 |
| JP | 2005-039264 | 2/2005 |
| JP | 2007-059518 | 3/2007 |
| JP | 2007-103891 | 4/2007 |
| JP | 2007-165612 | 6/2007 |
| JP | 2008-198876 | 8/2008 |

OTHER PUBLICATIONS

Japanese Office Action, w/ English translation thereof, issued in Japanese Patent Application No. JP 2009-267908 dated Dec. 20, 2011.

* cited by examiner

*Primary Examiner* — Long Pham
(74) *Attorney, Agent, or Firm* — McDermott Will & Emery LLP

(57) ABSTRACT

Disclosed is a semiconductor light emitting device, and a method of manufacturing the same. The semiconductor light emitting device includes a first conductivity type semiconductor layer, an active layer disposed on the top of the first conductivity type semiconductor layer, and a second conductivity type semiconductor layer disposed on the top of the active layer and comprising light extraction patterns in the top thereof, the light extraction patterns each having a columnar portion and a hemispherical top portion.

8 Claims, 5 Drawing Sheets

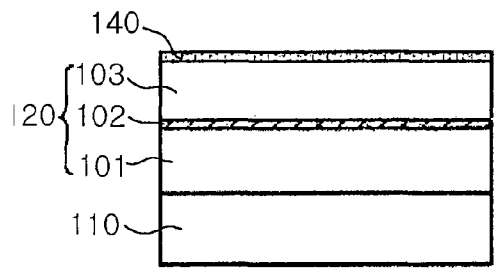
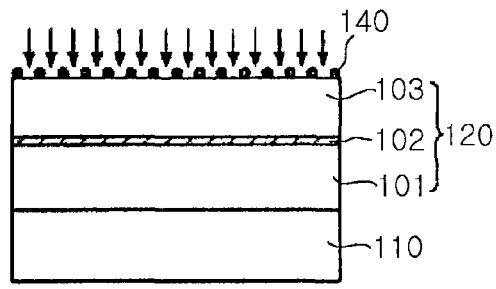
FIG. 4A  FIG. 4B
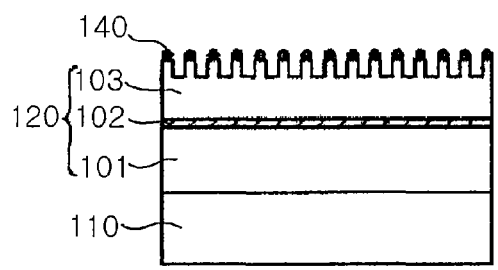
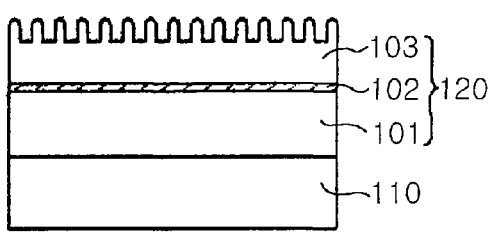
FIG. 4C  FIG. 4D
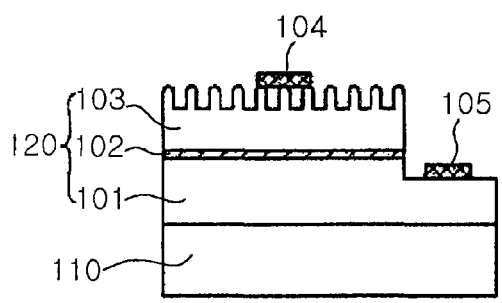
FIG. 4E

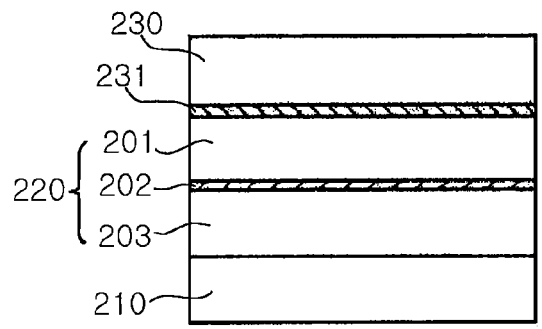
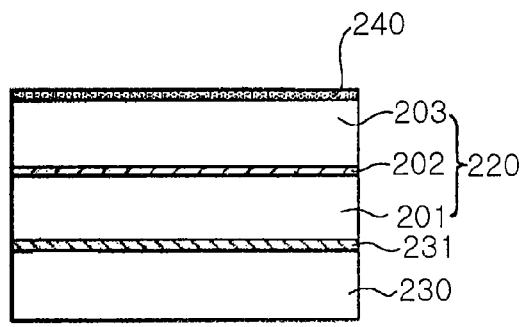
FIG. 5A  FIG. 5B
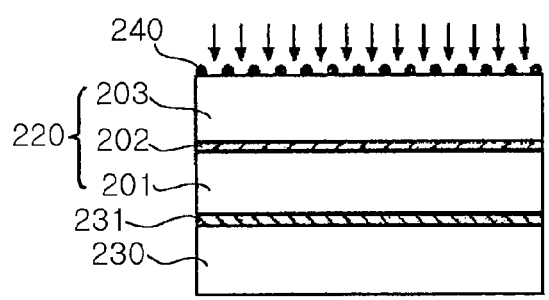
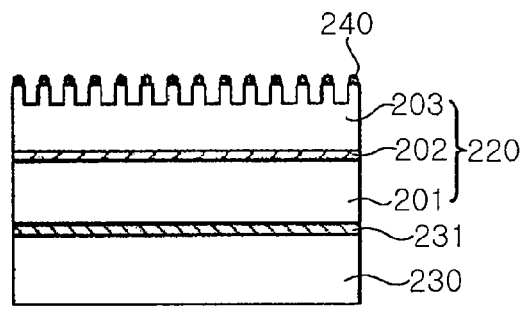
FIG. 5C  FIG. 5D
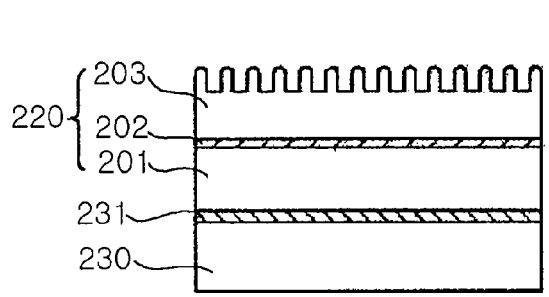
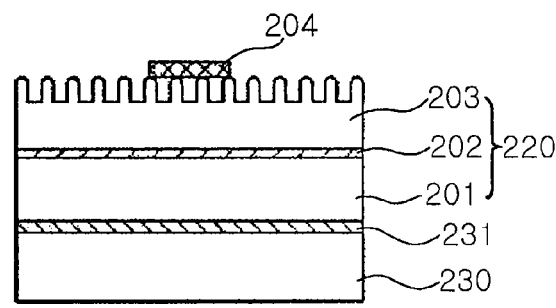
FIG. 5E  FIG. 5F

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2008-0122085 filed on Dec. 3, 2008, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same, and more particularly, to a semiconductor light emitting device that can realize superior light extraction efficiency by reducing the quantity of light traveling inside the device due to total internal reflection, and a method of manufacturing the same.

2. Description of the Related Art

Semiconductor light emitting diodes (LEDs), as one type of semiconductor device, generate light of various colors due to electron-hole recombination occurring at a p-n semiconductor junction when current is supplied. These semiconductor LEDs, greatly advantageous over filament-based light emitting devices, have a long useful life, low power use, superior initial driving characteristics, high vibration resistance and high tolerance to repetitive power connection/disconnection. This has continually boosted the demand for semiconductor LEDs. Notably, of late, a group III nitride semiconductor capable of emitting light at a short wavelength such as blue light has been highlighted.

However, semiconductor light emitting devices have limitations, one of which is low light emission efficiency. Light emission efficiency is determined depending on light generation efficiency and the efficiency of light emission to the outside of semiconductor light emitting devices. The internal quantum efficiency of semiconductor light emitting devices reaches approximately 100%, whereas the external quantum efficiency thereof is considerably low. This is because the total internal reflection of light generated inside the semiconductor light emitting devices is caused by different refractive indices of the devices and the air when the light strikes the boundaries of the devices. If light generated inside the devices strikes the boundary of the devices at an angle of incidence larger than the critical angle, the light is internally reflected without being extracted to the outside, significantly undermining the light extraction efficiency of the devices. Also, the light, which has failed to pass through the boundaries, travels inside the devices and converts into heat. This increases the amount of heat being generated by semiconductor light emitting devices, resulting in shorter useful life of the devices.

To solve this limitation, vertical type semiconductor light emitting devices or flip-chip semiconductor light emitting devices have been proposed by changing the locations of electrodes. However, the limitations concerning low light emission efficiency caused by total internal reflection still remain unsolved.

SUMMARY OF THE INVENTION

An aspect of the present invention provides a semiconductor light emitting device that can realize improved light extraction efficiency by reducing the quantity of light traveling inside the device due to total internal reflection.

According to an aspect of the present invention, there is provided a semiconductor light emitting device including: a first conductivity type semiconductor layer; an active layer disposed on the top of the first conductivity type semiconductor layer; and a second conductivity type semiconductor layer disposed on the top of the active layer and including light extraction patterns in the top thereof, the light extraction patterns each having a columnar portion and a hemispherical top portion.

The semiconductor light emitting device may further include: an insulating substrate disposed on the bottom of the first conductivity type semiconductor layer; a first electrode disposed on a portion of the first conductivity type semiconductor layer exposed by removing respective portions of the second conductivity type semiconductor layer and the active layer; and a second electrode disposed on the top of the second conductivity type semiconductor layer.

The semiconductor light emitting device may further include: a conductive substrate disposed on the bottom of the first conductivity type semiconductor layer; and a second conductivity type electrode disposed on the top of the second conductivity type semiconductor layer.

According to another aspect of the present invention, there is provided a method of manufacturing a semiconductor light emitting device, including: stacking a first conductivity type semiconductor layer, an active layer and a second conductivity type semiconductor layer on a substrate; stacking a mask layer on the top of the second conductivity type semiconductor layer; annealing the mask layer to be agglomerated, forming a plurality of mask patterns in the form of droplets; and dry etching the second conductivity type semiconductor layer on which the mask patterns are formed, to form light extraction patterns in the top of the second conductivity type semiconductor layer, the light extraction patterns each having a columnar portion and a hemispherical top portion.

The mask layer may include at least one metal selected from the group consisting of Ni, Ag, Ti, Pt and Au.

The mask layer may be an oxide layer formed of a material selected from the group consisting of ITO, ZnO, $SiO_2$ and TCO.

The mask layer may be deposited to a thickness of 1000 Å to 2000 Å.

The annealing is performed at a temperature ranging from 500° C. to 800° C.

The plurality of mask patterns in the form of droplets may be spaced apart from each other at a distance ranging from about 0.05 μm to 0.15 μm.

The method may further include, after the forming of the light extraction patterns, etching respective portions of the second conductivity type semiconductor layer and the active layer to expose a portion of the first conductivity type semiconductor layer; forming a first electrode on the exposed portion of the first conductivity type semiconductor layer; and forming a second electrode on the top of the second conductivity type semiconductor layer.

The stacking of the first conductivity type semiconductor layer, the active layer and the second conductivity type semiconductor layer may include: sequentially growing the second conductivity type semiconductor layer, the active layer, and the first conductivity type semiconductor layer on an insulating substrate; stacking a conductive substrate on the first conductivity type semiconductor layer; and removing the insulating substrate.

The method may further include forming a second conductivity type electrode on the top of the second conductivity type semiconductor layer after the forming of the light extraction patterns.

BRIEF DESCRIPTION OF THE DRAWINGS

The above and other aspects, features and other advantages of the present invention will be more clearly understood from the following detailed description taken in conjunction with the accompanying drawings, in which:

FIGS. 4A through 4E are cross-sectional views illustrating the processes associated with a method of manufacturing a semiconductor light emitting device, according to an exemplary embodiment of the present invention;

FIGS. 5A through 5F are cross-sectional views illustrating the processes associated with a method of manufacturing a semiconductor light emitting device, according to another exemplary embodiment of the present invention.

DETAILED DESCRIPTION OF THE PREFERRED EMBODIMENT

Figure 1:
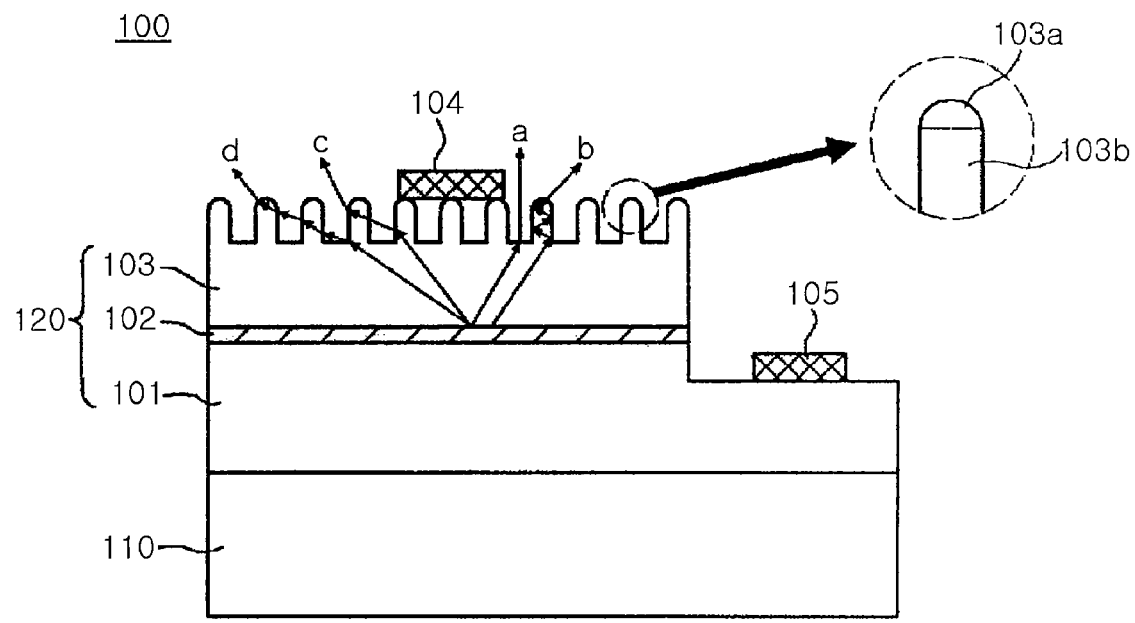
FIG. 1 is a cross-sectional view of a semiconductor light emitting device according to an exemplary embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and like reference numerals in the drawings denote like elements.

FIG. 1 is a cross-sectional view of a semiconductor light emitting device according to an exemplary embodiment of the present invention. Referring to FIG. 1, a semiconductor light emitting device 100, according to this embodiment, includes a light emission structure 120 including a first conductivity type semiconductor layer 101, an active layer 102 disposed on the top of the first conductivity type semiconductor layer 101, and a second conductivity type semiconductor layer 103 disposed on the top of the active layer 102. The light emission structure 120 is disposed on an insulating substrate 110. The semiconductor light emitting device 100 is a horizontal type semiconductor light emitting device 100 in which a first electrode 105 is formed on an exposed region of the first conductivity type semiconductor layer 101, and a second electrode 104 is formed on the second conductivity type semiconductor layer 103. Here, the exposed region of the first conductivity type semiconductor layer 101 is formed by removing respective portions of the second conductivity type semiconductor layer 103 and the active layer 102.

The first and second conductivity type semiconductor layers 101 and 103 and the active layer 102 of the light emission structure 120 are formed of nitride semiconductors although they are not limited thereto. In this specification, the term ' light emission structure' refers to a sequential stack of the first conductivity type semiconductor layer 101, the active layer 102 and the second conductivity type semiconductor layer 103. The first and second conductivity type semiconductor layers 101 and 103 may be formed of semiconductor materials of AlxInyGa (1−x−y)N where and $0 \leq x \leq 1$, $0 \leq y \leq 1$, and $0 \leq x+y \leq 1$, each of which is doped with n-type impurities or p-type impurities. Representative examples of the semiconductor materials may include GaN, AlGaN and InGaN. Also, Si, Ge, Se, Te or C may be used as the n-type impurities, and Mg, Zn or Be may be used as the p-type impurities. The active layer 102 generates light by the recombination of electron-hole pairs. According to this embodiment, the active layer 102 may be configured as a nitride semiconductor layer having a single quantum well structure or a multi-quantum well structure.

Although nitride semiconductors are used in this embodiment, the present invention is not limited thereto, and any other kinds of semiconductor materials known in the art may also be used.

The second conductivity type semiconductor layer 103 of the light emission structure 120 includes a plurality of light extraction patterns in its top surface. Each of the light extraction patterns has a hemispherical top portion 103a and a columnar portion 103b.

The light extraction patterns, each having the hemispherical top portion 103a and the columnar portion 103b, are formed by etching a part of the second conductivity type semiconductor layer 103. The light extraction patterns are surrounded by a layer of air.

As for related art semiconductor light emitting devices, light generated from active layers is emitted into the air (to Si resin in the case of packages or the like) through second conductivity type semiconductor layers. In this case, light having an angle of incidence greater than the critical angle is trapped inside without being extracted to the outside.

In contrast, the semiconductor light emitting devices according to this embodiment include light extraction patterns, each having the hemispherical top portion 103a and the columnar portion 103b, thereby enhancing light extraction efficiency. When striking the second conductivity type semiconductor layer 103 at an angle of incidence smaller than the critical angle, light from the active layer 102 is extracted to the outside of the semiconductor light emitting device (see 'a' in FIG. 1). A portion of light striking the second conductivity type semiconductor layer 103 at an angle of incidence, which is equal to or greater than the critical angle, is trapped inside the columnar portion 103b of the light extraction pattern. However, the trapped light travels through the columnar portion 103b and is extracted to the outside through the hemispherical top portion 103a (see 'b' in FIG. 1), since the refractive index of a material (e.g., air) surrounding the columnar portion 103b of the light extraction pattern is smaller than that of the second conductivity type semiconductor layer 103. A portion of light having an angle of incidence, which is equal to or greater than the critical angle and not trapped inside the columnar portion 103b is extracted through the material with a low refractive index (see 'c' in FIG. 1). If a portion of light having an angle of incidence, which is equal to or greater than the critical angle and not trapped inside the columnar portion 103b strikes the interface between the hemispherical portion 103a and the columnar portion 103b, the light can be extracted through the interface (see 'd' in FIG. 1).

The light extraction patterns, each having the hemispherical top portion 103a and the columnar portion 103b, may be spaced from each other at an interval ranging from 0.05 μm to 1.5 μm, although they are not limited thereto.

The height of the light extraction patterns is not limited provided that the active layer 102 is not exposed.

The formation of the light extraction patterns, each having the hemispherical top portion 103a and the columnar portion 103b, at the top of the second conductivity type semiconductor layer 103 will be described later.

The insulating substrate 110 is provided to grow single crystals, and may be, for example, a sapphire substrate. The sapphire substrate is a crystal body having hexa-Rhombo R3c symmetry, and has characteristics such as a lattice constant of 13.001 Å in the direction of the c-axis, a distance between lattices of 4.765 Å in the direction of the c-axis, and a C (0001) plane, A (1120) plane and R (1102) plane. Since the sapphire substrate is advantageous to the growth of a GaN thin film and is stable at a high temperature, it is primarily used to grow nitride. Instead of the sapphire substrate for the growth of a nitride semiconductor, a substrate of SiC, $MgAl_2O_4$, MgO, $LiAlO_2$ or $LiGaO_2$ may be used.

Figure 2:
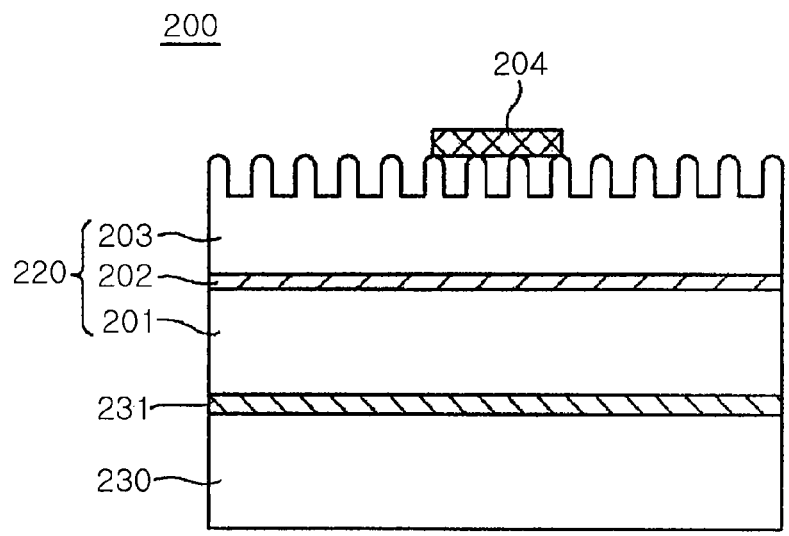
FIG. 2 is a cross-sectional view of a semiconductor light emitting device according to another exemplary embodiment of the present invention.

FIG. 2 is a cross-sectional view of a semiconductor light emitting device according to another exemplary embodiment of the present invention.

Referring to FIG. 2, a semiconductor light emitting device 200, according to this embodiment, includes a light emission structure 120 including a first conductivity type semiconductor layer 101, an active layer 102 disposed on the top of the first conductivity type semiconductor layer 101; and a second conductivity type semiconductor layer 103 disposed on the active layer 102. A conductive substrate 130 is disposed on the bottom of the first conductivity type semiconductor layer 101 to support the light emission structure 120. In this case, the semiconductor light emitting device 200 is a vertical type semiconductor light emitting device in which the conductive substrate 130 serves as a first conductivity type electrode, and a second electrode 104 is formed on the second conductivity type semiconductor layer 103.

The second conductivity type semiconductor layer 103 has a plurality of light extraction patterns at the top thereof. Each of the light extraction patterns has a hemispherical top portion 103a and a columnar portion 103b. The light extraction patterns are the same as those described above.

The conductive substrate 130 serves as both a first conductivity type electrode and a support supporting the light emission structure 120. The conductive substrate 130 may contain a material selected from the group consisting of Si, Cu, Ni, Au, W and Ti.

The conductive substrate 130 may be a substrate provided to grow semiconductor single crystals. Alternatively, semiconductor single crystals may be grown on a sapphire substrate, which is advantageous to the growth of single crystals, and then the conductive substrate 130 may be stacked on the opposite side of the semiconductor single crystal growth surface before the sapphire substrate is removed.

A highly reflective ohmic contact layer 131 may be further included between the conductive substrate 130 and the light emission structure 120. The highly reflective ohmic contact layer 131, although not essential for the present invention, may serve to make an ohmic contact with the first conductivity type semiconductor layer 101 and also serve to reflect light emitted from the active layer 102 toward the second conductivity type semiconductor layer 103, thereby enhancing light emission efficiency. To this end, the highly reflective ohmic contact layer 131 may have reflectivity of 70% or higher, and may be formed of a material containing at least one of, for example, Ag, Ni, Al, Rh, Pd, Ir, Ru, Mg, Zn, Pt and Au. Although not shown, the highly reflective ohmic contact layer 131 may have a multilayered structure to improve reflection efficiency. For example, the multilayered structure may be Ni/Ag, Zn/Ag, Ni/Al, Zn/Al, Pd/Ag, Pd/Al, Ir/Ag, Ir/Au, Pt/Ag, Pt/Al or Ni/Ag/Pt.

Figure 3:
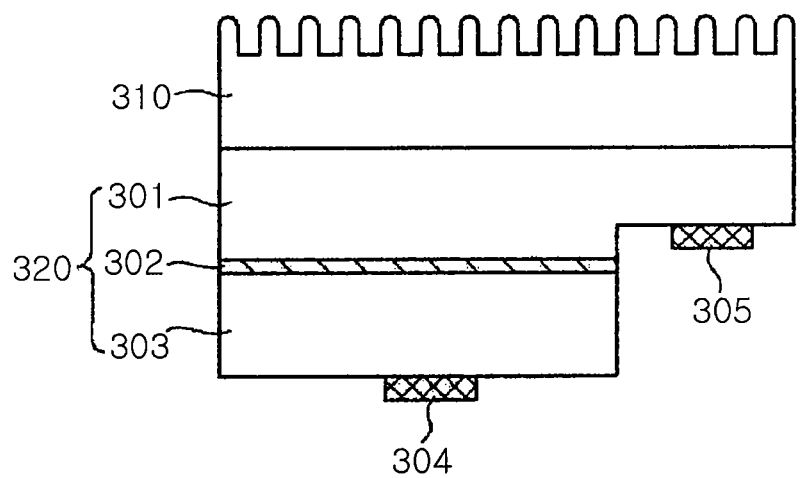
FIG. 3 is a cross-sectional view of a semiconductor light emitting device according to another exemplary embodiment of the present invention.

FIG. 3 is a cross-sectional view of a semiconductor light emitting device according to another exemplary embodiment of the present invention.

Referring to FIG. 3, light extraction patterns may be formed in the bottom of the insulating substrate 110 to fabricate a flip chip type semiconductor light emitting device, unlike the embodiments of FIGS. 1 and 2 in which the light extraction patterns are formed in the top of the second conductivity type semiconductor layer 103.

Hereinafter, methods of manufacturing the above semiconductor light emitting devices will be described.

FIGS. 4A through 4E are cross-sectional views of the processes associated with a method of manufacturing a semiconductor light emitting device, according to an exemplary embodiment of the present invention.

As shown in FIG. 4A, the light emission structure 120 including the first conductivity type semiconductor layer 101, the active layer 102 and the second conductivity type semiconductor layer 103 is stacked on the insulating substrate 110. The stacking process of the light emission structure 120 on the insulating substrate 110 may be realized by sequentially growing the first conductivity type semiconductor layer 101, the active layer 102 and the second conductivity type semiconductor layer 103 on the insulating substrate 110, which serves as a semiconductor growth substrate. The first and second conductivity type semiconductor layers 101 and 103 may be grown by use of a known process, such as metal organic chemical vapor (MOCVD), molecular beam epitaxy (MBE) or hydride vapor phase epitaxy (HVPE). Although not shown, a buffer layer may be grown before the growth of the first conductivity type semiconductor layer 101.

Thereafter, a mask layer 140 of a metallic material is stacked on the surface of the second conductivity type semiconductor layer 103. The mask layer 140 may contain at least one metal selected from the group consisting of Ni, Ag, Ti, Pt and Au. The mask layer 140 may be an oxide layer formed of a material selected from the group consisting of ITO, ZnO, $SiO_2$ and TCO.

The mask layer 140 may be deposited with a thickness ranging from 1000 Å to 2000 Å. However, the thickness of the mask layer 140 is not limited to the description.

Thereafter, the mask layer 140 is annealed. A temperature and time for the annealing process may be varied according to the properties of the material used in the mask layer 140. In general, the annealing may be performed at a temperature of 500° C. to 800° C. for more than one second.

Figure 6:
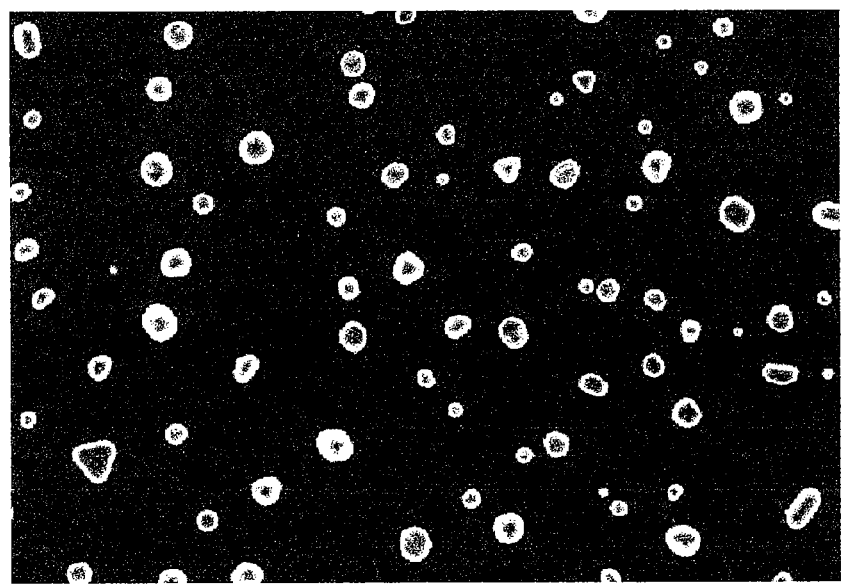
FIG. 6 is a photographic image showing droplet-shaped mask patterns formed in the process of manufacturing a semiconductor light emitting device, according to an exemplary embodiment of the present invention.

As shown in FIG. 4B, in the annealing process, the mask layer 140 undergoes a self agglomeration due to surface tension to reduce surface energy, thereby forming mask patterns 140 in the form of droplets (hereinafter, also referred to as droplet-shaped mask patterns 140). FIG. 6 is a photographic image showing the droplet-shaped mask patterns formed by forming a mask layer of Pt at 5 nm and annealing the mask layer at 800° C.

In this case, the mask patterns 140 may be spaced apart from each other at an interval of about 0.05 μm to 0.15 μm.

Thereafter, the second conductivity type semiconductor layer 103 including the mask patterns 140 are dry etched. For the dry etching process, inductively coupled plasma (ICP)/reactive ion etching (RIE) may be used. In the process of dry etching, a reactive gas is provided to an exposed portion of the second conductivity type semiconductor layer 103 where the droplet-shaped mask patterns are not formed, in the direction of arrows of FIG. 4B, thereby etching the exposed portion thereof. Accordingly, as shown in FIG. 4C, the exposed portion of the second conductivity type semiconductor layer 103 is etched to form grooves of a predetermined depth, thereby forming columnar patterns. The respective top portions of the columnar patterns on which the droplet-shaped mask patterns are placed have a hemispherical shape.

After the column patterns are formed through the etching process, the mask patterns 140 are removed using a wet etching process. For example, an acid solution (e.g., sulphuric acid solution) maybe used to remove the mask patterns 140. In this case, if an oxide layer is used as the mask layer, the mask patterns 140 may not be removed since the oxide layer is transparent and has a similar refractive index to that of a semiconductor layer.

FIG. 4D illustrates the state where the mask patterns 140 have been removed. As grooves are formed by the etching process, portions, which are not etched, each have a columnar portion and a hemispherical top portion.

Thereafter, as shown in FIG. 4E, the respective portions of the second conductivity type semiconductor layer 103 and active layer 102 are etched to expose the first conductivity type semiconductor layer 101. The first electrode 105 is formed on the exposed region of the first conductivity type semiconductor layer 101, and the second electrode 104 is formed on the top of the second conductivity type semiconductor layer 103, thereby manufacturing a horizontal type semiconductor light emitting device 100.

FIGS. 5A through 5F are cross-sectional views of the processes associated with a method of manufacturing a semiconductor light emitting device, according to another exemplary embodiment of the present invention.

As shown in FIG. 5B, the light emission structure 120, including the first conductivity type semiconductor layer 101, the active layer 102 and the second conductivity type semiconductor layer 103, is stacked on the conductive substrate 130.

If the conductive substrate 130 is used, it may be difficult to grow semiconductor crystals. Therefore, semiconductor crystals may be grown on a substrate such as a sapphire substrate, which is advantageous to the growth of semiconductor crystals, and then the conductive substrate 130 may be formed on the outermost first conductivity type semiconductor layer 101. In more detail, as shown in FIG. 5A, the light emission structure 120 is grown on the semiconductor growth substrate 110. Here, the second conductivity type semiconductor layer 103, the active layer 102 and the first conductivity type semiconductor layer 101 are sequentially grown on the semiconductor growth substrate 110. Thereafter, the conductive substrate 130 is stacked on the top of the first conductivity type semiconductor layer 101, and then the semiconductor growth substrate 110 is removed. When the semiconductor growth substrate 110 is removed, the handling of the relatively thin and light emission structure 120 may be facilitated by the use of the conductive substrate 130.

The semiconductor growth substrate 110 is removed, exposing one surface of the second conductivity type semiconductor layer 103 to the outside. In this process, a laser lift-off process (LLO) may be used. However, the present invention is not limited, and the growth substrate 110 may be separated by use of other mechanical or chemical processes.

The highly reflective ohmic contact layer 131 may be stacked at the time of the stacking of the conductive substrate 130.

The highly reflective ohmic contact layer 140 may formed by use of various known techniques, such as sputtering or deposition.

As shown in FIG. 5B, the mask layer 140 is stacked on the surface of the second conductivity type semiconductor layer 103.

Thereafter, annealing and etching are performed as described above. FIGS. 5C through 5E are the same processes as those illustrated in FIGS. 4B through 4D.

Thereafter, as shown in FIG. 5F, the second conductivity type electrode 104 is formed on the top of the second conductivity type semiconductor layer 103, thereby manufacturing a vertical type semiconductor light emitting device 200.

As set forth above, according to exemplary embodiments of the invention, light extraction efficiency is enhanced by the light extraction patterns formed in the top of the second conductivity type semiconductor layer, which is a light emission surface. The light extraction patterns each have a columnar portion and a hemispherical top portion, and serve to reduce the quantity of light traveling inside the device due to total internal reflection. The light extraction patterns formed on light emission surfaces are applicable to flip-chip type semiconductor LEDs as well as horizontal type and horizontal type semiconductor light emitting devices.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a semiconductor light emitting device, the method comprising:
   stacking a first conductivity-type semiconductor layer, an active layer and a second conductivity-type semiconductor layer on a substrate;
   stacking a mask layer on a top surface of the second conductivity-type semiconductor layer, the mask layer being an oxide layer formed of $SiO_2$;
   annealing the mask layer to be agglomerated and to form a plurality of mask patterns having the form of droplets; and
   dry etching the second conductivity-type semiconductor layer on which the mask patterns are formed, to form light extraction patterns in a top portion of the second conductivity-type semiconductor layer, the light extraction patterns each having a columnar portion and a hemispherical top portion,
   wherein the mask patterns are not removed after the step of dry etching the second conductivity-type semiconductor layer on which the mask patterns are formed.

2. The method of claim 1, wherein the mask layer is deposited to a thickness of 1000 Å to 2000 Å.

3. The method of claim 1, wherein the annealing is performed at a temperature ranging from 500° C. to 800° C.

4. The method of claim 1, wherein the plurality of mask patterns in the form of droplets are spaced apart from each other at a distance ranging from about 0.05 μm to 0.15 μm.

5. The method of claim 1, further comprising, after the forming of the light extraction patterns:
   etching respective portions of the second conductivity-type semiconductor layer and the active layer to expose a portion of the first conductivity-type semiconductor layer;
   forming a first electrode on the exposed portion of the first conductivity-type semiconductor layer; and
   forming a second electrode on the top of the second conductivity-type semiconductor layer.

6. The method of claim 1, wherein the stacking of the first conductivity-type semiconductor layer, the active layer and the second conductivity-type semiconductor layer comprises:
   sequentially growing the second conductivity-type semiconductor layer, the active layer, and the first conductivity-type semiconductor layer on an insulating substrate;

stacking a conductive substrate on the first conductivity-type semiconductor layer; and
removing the insulating substrate.

7. The method of claim 6, further comprising forming a second conductivity-type electrode on the top of the second conductivity-type semiconductor layer after the forming of the light extraction patterns.

8. The method of claim 1, wherein
the columnar portion of each of the light extraction patterns has a predetermined depth, and
a respective top portion of the columnar portion of each light extraction pattern has a hemispherical shape.

* * * * *